US009646759B1

(12) United States Patent
Zhang (10) Patent No.: US 9,646,759 B1
(45) Date of Patent: May 9, 2017

(54) LC TANK CIRCUITRY WITH SHIELDING STRUCTURES

(71) Applicant: Altera Corporation, San Jose, CA (US)

(72) Inventor: Yaxing Zhang, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/251,364

(22) Filed: Apr. 11, 2014

(51) Int. Cl.
| H01F 27/36 | (2006.01) |
| H01F 5/00 | (2006.01) |
| H01F 27/28 | (2006.01) |
| H01F 41/00 | (2006.01) |

(52) U.S. Cl.
CPC ........... H01F 27/288 (2013.01); H01F 41/00 (2013.01)

(58) Field of Classification Search
CPC .. H01F 27/28; H01F 27/2804; H01F 27/2885; H01F 27/36; H01F 27/362; H01F 41/00; H01F 41/041; H01F 5/003; H01F 17/0006; H01F 27/265; H01F 2017/008; H01F 2017/0086
USPC ......... 336/84 C, 200, 232, 84 R, 84 M, 226; 29/602.1
See application file for complete search history.

(56) References Cited

U.S. PATENT DOCUMENTS

| 7,259,625 | B2 | 8/2007 | Sanderson | |
| 8,427,266 | B2 | 4/2013 | Wu et al. | |
| 8,559,186 | B2 | 10/2013 | Jin | |
| 8,587,398 | B2 * | 11/2013 | Wu | H01F 17/0006 336/84 C |
| 2004/0007760 | A1 | 1/2004 | Lowther | |
| 2004/0124840 | A1 * | 7/2004 | Reykowski | 324/318 |
| 2006/0163692 | A1 * | 7/2006 | Detecheverry et al. | 257/531 |
| 2006/0220737 | A1 * | 10/2006 | Sanderson | 330/69 |
| 2011/0006872 | A1 * | 1/2011 | Nazarian et al. | 336/84 C |
| 2011/0273261 | A1 * | 11/2011 | Signoff et al. | 336/84 C |
| 2014/0118963 | A1 * | 5/2014 | Lenive et al. | 361/748 |

* cited by examiner

*Primary Examiner* — Mangtin Lian
(74) *Attorney, Agent, or Firm* — Treyz Law Group, P.C.; Jason Tsai; Andrew C. Milhollin (57) ABSTRACT

An integrated circuit having a resonant circuit is provided. The resonant circuit may include an inductor and a capacitor coupled in parallel. The inductor may be formed in a dielectric stack on a semiconductor substrate. An inductor shielding structure may be interposed between the inductor and the semiconductor substrate in the dielectric stack. The inductor shielding structure may be a closed loop structure that is electrically floating. The inductor shielding structure may also be formed using a figure 8 routing arrangement that is symmetrical to help cancel out any induced current from the inductor. A resonant circuit formed in this way may exhibit an enhanced Q factor.

19 Claims, 7 Drawing Sheets

LC TANK CIRCUITRY WITH SHIELDING STRUCTURES

BACKGROUND

This relates generally to integrated circuits, and more particularly, to integrated circuits with inductors.

Integrated circuits often include circuitry such as wireless communications circuitry that uses inductors. Inductor-based wireless communications circuitry typically includes a resonant circuit that is formed by an inductor and capacitors connected in parallel. This type of resonant circuit is sometimes referred to as an LC "tank."

An LC tank can be characterized by a tank quality factor Q, which is a dimensionless metric that describes the bandwidth of the resonant circuit relative to its center frequency. The tank Q may be defined as the ratio of the powered stored in the resonant circuit to the power dissipated by the resonant circuit via resistance and reactance. As a result, a higher tank Q typically indicates a lower rate of energy loss relative to the stored energy in the tank and a better frequency selectivity of the band-pass filter, whereas a lower tank Q indicates a higher rate of energy loss and worse frequency selectivity.

It is generally desirable to form LC tanks that exhibit higher Q factors. In conventional integrated circuits, inductor structures and capacitor structures are typically formed over a p-type silicon substrate. During operation of the LC tank, the inductor may apply an AC electric field to the p-type silicon substrate, which may induce undesired current flow in the silicon substrate (i.e., the LC tank may suffer from energy loss due to parasitic capacitive coupling to the silicon substrate). This effect is exacerbated at high frequencies of operation such as in the 10 GHz range and beyond for an on-chip inductor in the LC tank. Loss incurred in this way can result in an undesirable amount of power being consumed and a degradation of the frequency selectivity.

It is within this context that the embodiments described herein arise.

SUMMARY

An integrated circuit that includes a resonant circuit is provided. The resonant circuit may include an inductor and adjustable capacitor circuitry connected in parallel. A resonant circuit formed in this way is sometimes referred to as an LC tank.

The inductor may be formed over the substrate. In particular, the inductor may be formed in a dielectric stack that is formed on the substrate. An inductor shielding structure may be interposed between the substrate and the inductor. The inductor shielding structure may be an electrically floating, closed loop structure that is implemented using a figure 8 symmetrical routing arrangement.

The inductor and the inductor shielding structure may have substantially similar shapes and footprints. The inductor shielding structure may have a routing path crossing point that is formed at the center of the inductor shielding structure (e.g., underpass or overpass bridging structures may be formed at the crossing point to provide proper closed loop routing). In particular, the inductor shielding structure may include conductive paths connecting the crossing point to outer loop portions of the inductor shielding structure. These conductive paths may be formed using metal paths formed in at least two metal routing layers in the dielectric stack to help minimize resistance. In other arrangements, this conductive path portion may be formed using metal paths formed in at least three metal routing layers in the dielectric stack. In yet other suitable arrangements, only the center crossing portion of the shielding structure includes conductive structures formed in more than one metal routing layer in the dielectric stack.

If desired, the inductor may include loops that are formed in multiple metal routing layers in the dielectric stack and that are shorted in parallel through vias along the entire winding of the inductor. LC tank inductor structures formed in this way may exhibit low loss and enhanced Q factors.

Further features of the present invention, its nature and various advantages will be more apparent from the accompanying drawings and the following detailed description.

DETAILED DESCRIPTION

Embodiments of the present invention relate to integrated circuits with inductors. The integrated circuits that have inductors may be any suitable type of integrated circuit, including processors, memory chips, programmable integrated circuits, application-specific integrated circuits, audio and video circuits, etc. The inductors may be used in implementing oscillators, radio-frequency circuits, filter circuits (e.g., for reducing noise on data or power lines), just to name a few.

Figure 1:
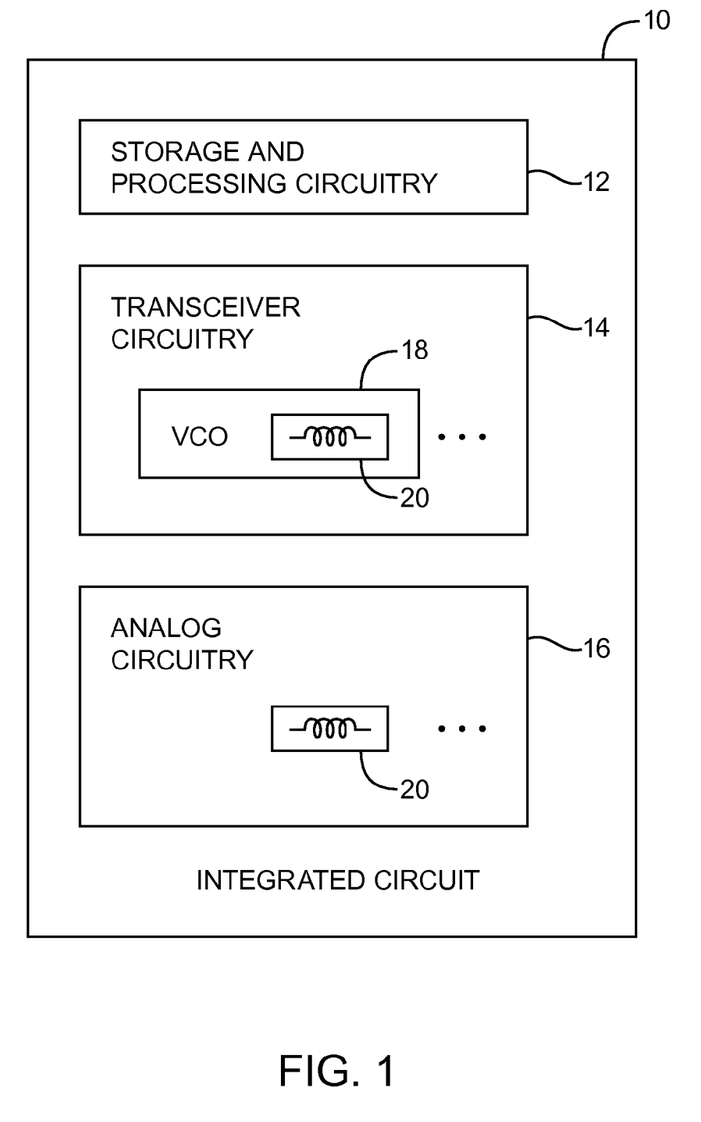
FIG. 1 is a diagram of an illustrative integrated circuit with inductors in accordance with an embodiment of the present invention.

An integrated circuit of the type that may be provided with one or more inductors is shown in FIG. 1. Integrated circuit 10 may include wireless circuitry such as radio-frequency transceiver circuitry and may therefore sometimes be referred to as a wireless integrated circuit. As shown in FIG. 1, integrated circuit 10 may include storage and processing circuitry 12 and wireless communications circuitry such as transceiver circuitry 14 and other radio-frequency circuitry. Integrated circuit 10 may also include analog circuitry such as analog circuitry 16, input-output (I/O) circuitry, digital circuitry, and other circuitry. Storage and processing circuitry 12 may include memory circuitry, logic circuits, arithmetic circuits, and/or other control circuitry that serve to implement the desired function of integrated circuit 10.

Transceiver circuitry 14 may, for example, include at least one voltage-controlled oscillator (VCO) such as voltage-controlled oscillator 18. Voltage-controlled oscillator 18 may be used as part of a phase-locked loop (as an example). If desired, more than one voltage-controlled oscillator 18 may be formed on integrated circuit 10.

Each voltage-controlled oscillator 18 may include an inductor such as inductor 20. Inductor 20 may sometimes be referred to as an on-chip inductor, because inductor 20 is embedded within the integrated circuit (e.g., inductor 20 may be formed in a dielectric stack on the surface of the silicon substrate from which the circuitry of integrated circuit 10 is formed). Integrated circuit 10 may have other radio-frequency circuitry such as equalizers, filters, and matching circuits that include inductors. Inductor 20 may also be used in filters (e.g., to reduce noise on input-output pins, power supply lines, data lines, etc.), or in other circuits. As shown in FIG. 1, analog circuitry 16 may also include at least one inductor 20.

In general, inductors 20 may be passive electrical components that store energy in the form of magnetic fields. Inductors 20 may be formed using conductive lines arranged in a loop. The conductive lines may be formed from patterned traces (e.g., copper traces or traces of other metals) that are formed in one or more layers of a dielectric stack. The dielectric stack of an integrated circuit includes layers of silicon oxide or other dielectric material within which conductive structures are formed. A dielectric stack typically includes metal interconnect layers (also sometimes referred to as metal layers or metal routing layers) and via layers. The metal routing layers may include metal routing lines (also sometimes referred to as interconnects). The via layers may contain vertical conducting structures (e.g., conductive vias such as tungsten vias or other metal vias).

If desired, metal may be omitted from a portion of a metal layer or via layer (e.g., to form a region of uninterrupted dielectric). Inductors 20 may be formed from metal lines in the metal routing layers and from vias in the via layers. The configurations used for the metal lines, vias, and blank regions (i.e., the uninterrupted layers of dielectric) may be selected so as to enhance inductor performance.

Figure 2:
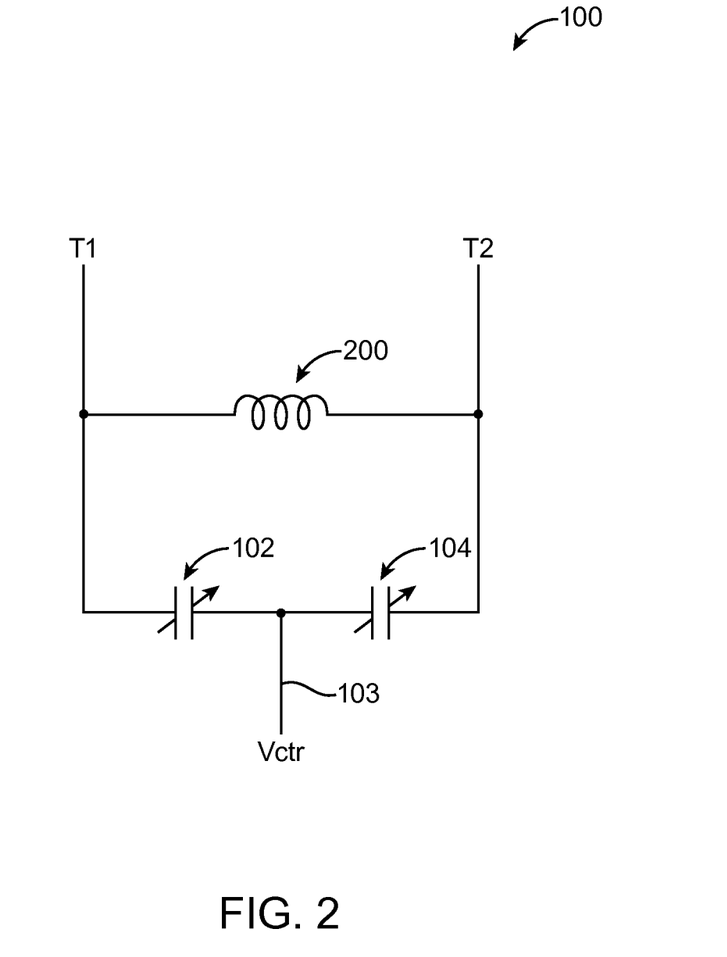
FIG. 2 is a circuit diagram of an illustrative LC tank in accordance with an embodiment of the present invention.

Voltage-controlled oscillator 18 may include a resonant circuit such as resonant circuit 100 of FIG. 2. As shown in FIG. 2, resonant circuit 100 includes an inductor 200 coupled in parallel with associated adjustable capacitors 102 and 104. In particular, inductor 200 may have a first terminal that is coupled to port T1, which serves as a first input-output port for circuit 100, and a second terminal that is coupled to port T2, which serves as a second input-output port for circuit 100. Capacitors 102 and 104 may be coupled in parallel with inductor 200 and in series between ports T1 and T2.

Both capacitors 102 and 104 may receive a control voltage Vctr via a control path 103 that is coupled to an intermediate node at which capacitors 102 and 104 are connected. Control voltage Vctr may have a value that can be adjusted to tune the capacitance of capacitors 102 and 104. Capacitors 102 and 104 having capacitances that are tunable are sometimes referred to as variable capacitors, varicaps, and varactors. Resonant circuit 100 may exhibit a resonant frequency that is dependent on the values of inductor 200 and the associated varactors. The resonant frequency can therefore be shifted to desired center frequencies by appropriately tuning Vctr to adjust the capacitance of the varactors.

Resonant circuit 100 of the type described in connection with FIG. 2 is sometimes referred to as an "LC tank." The performance of an LC tank can be characterized by a metric commonly referred to as the quality (Q) factor. The Q factor of an LC tank can be defined as the ratio of the energy stored in the tank to the energy dissipated by the tank. LC tanks with higher Q factors are typically more energy efficient and exhibit better frequency selectivity relative to LC tanks with lower Q factors. As a result, it is generally desirable to form LC tanks with higher Q factors.

Conventional LC tanks include inductors and capacitors formed over a p-type silicon substrate. During operation of the LC tank, the inductors may apply an AC electric field on the silicon substrate, which induces existing holes in p-type the silicon substrate to flow and can result in undesired current flow in the silicon substrate. This type of capacitive coupling between the inductor and the silicon substrate therefore results in power loss through the conducting substrate (especially at high frequency operations at or beyond 10 GHz) and substantially degrades the Q factor of the LC tank.

Figure 3:
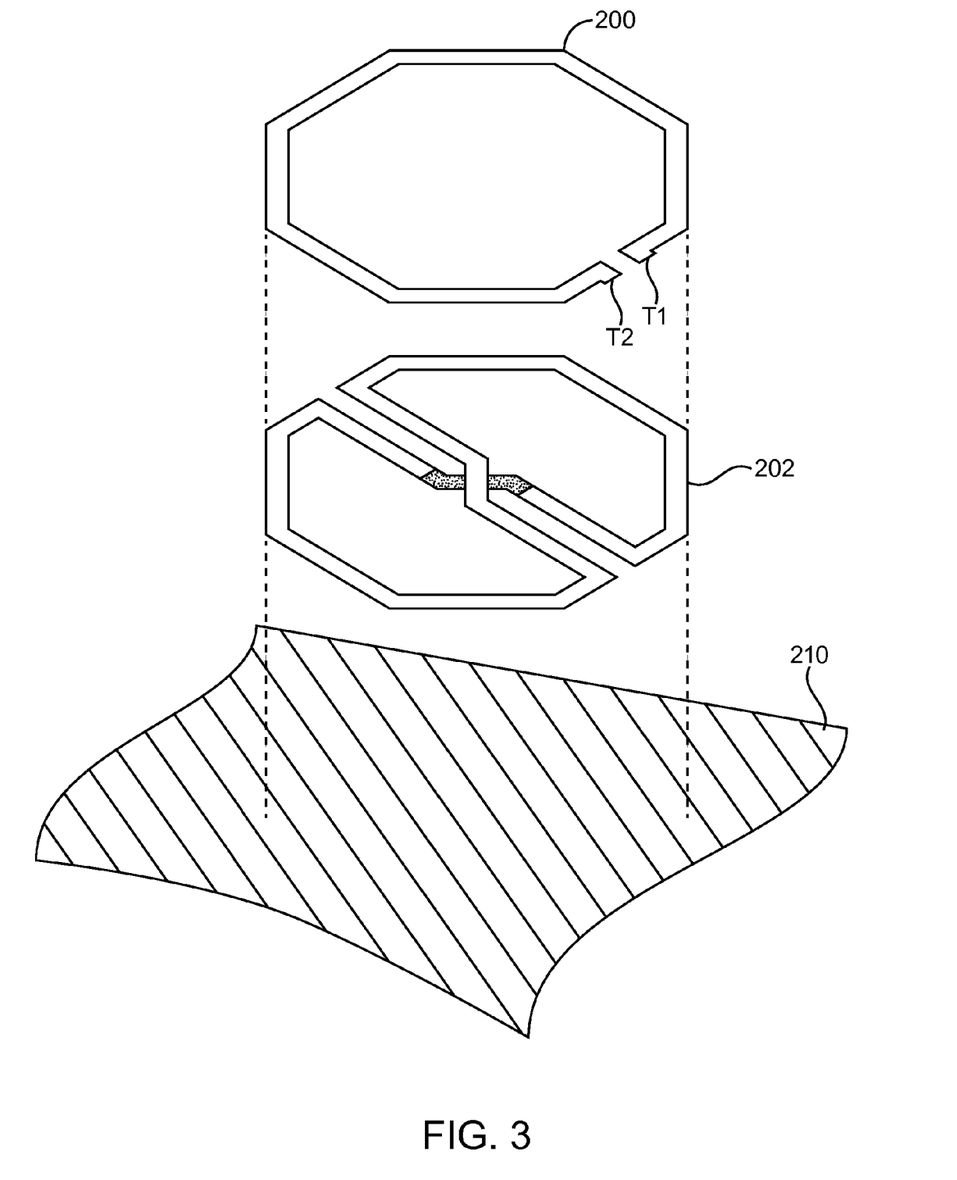
FIG. 3 is an exploded perspective view of an inductor having a substrate shielding structure in accordance with an embodiment of the present invention.

In accordance with an embodiment of the present invention, an inductor shielding structure may be interposed between the inductor and the substrate. FIG. 3 is an exploded perspective view showing how an inductor shielding structure 202 may be interposed between inductor 200 and semiconductor substrate 210. Semiconductor substrate 210 may be formed from p-type silicon material, n-type silicon material, or other suitable types of integrated circuit substrate material. Shielding structure 202 may sometimes be considered as part of inductor 200. Inductor 200 that is being shielded by structure 202 may be referred to as a shielded inductor.

Structures 200 and 202 may be formed in a dielectric stack that is formed on substrate 210. The dielectric stack (not explicitly shown in FIG. 3) may include alternating metal routing layers and via layers. In particular, structure 200 may be formed in a metal routing layer that is further away from substrate 210 than the metal routing layer in which structure 202 is formed (e.g., structure 200 is formed in a higher metal layer above structure 202). Structure 202 may have the same general shape and dimension (or footprint) as structure 200 and may be formed directly below and aligned with structure 200 for optimal shielding. This need not be the case. In other suitable arrangements, structure 202 may have different shapes and dimensions as structure 200.

Inductor 200 may have ports T1 and T2 that are coupled to other circuitry on device 10 (e.g., inductor 200 may be coupled to associated capacitors in an LC tank via metal routing paths formed in the dielectric stack), whereas shielding structure 202 may be electrically floating (i.e., structure 202 is not actively driven by a pull-up or pull-down circuit). As shown in FIG. 3, shielding structure 202 may also be implemented in a figure 8 routing arrangement, the advantage of which will be described in connection with the following figures.

Figure 4:
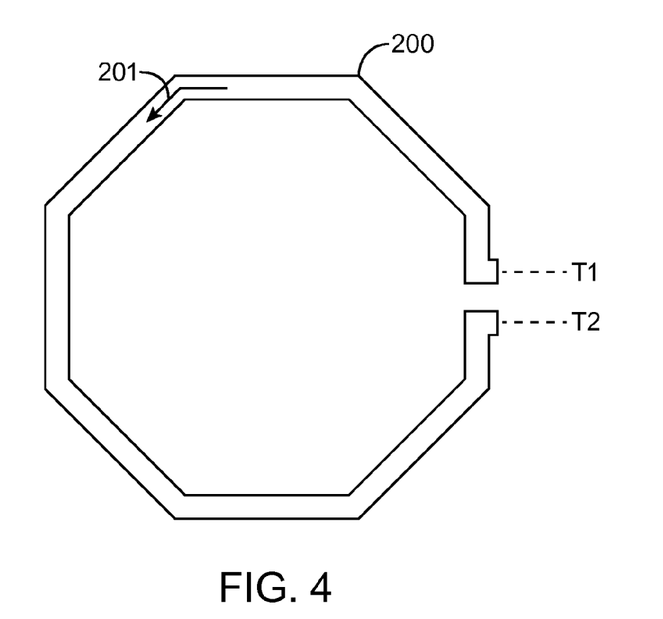
FIG. 4 is a top view of an illustrative single-turn inductor in accordance with an embodiment of the present invention.

FIG. 4 shows a top view of inductor 200. In some embodiments, inductor 200 may be a differential inductor that receives a differential signal at input ports T1 and T2. For example, inductor 200 may receive a "positive" input signal at T1 and a "negative" input signal at T2 at a given point in time, and may receive a negative input signal at T1 and a positive input signal at T2 at another point in time. Consider the scenario in which inductor 200 receives a positive signal at input T1 and a negative signal at input T2. This particular biasing arrangement may result in a current 201 to flow through inductor 200 in a counterclockwise direction (as an example).

Figure 5:
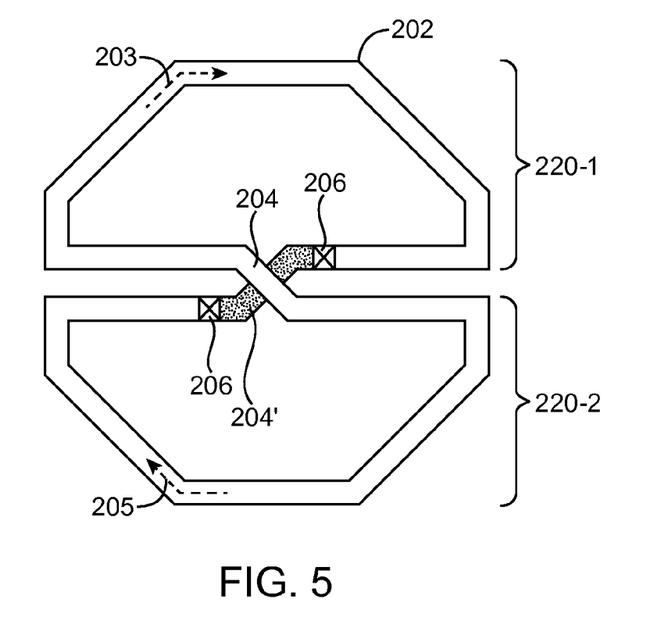
FIG. 5 is a top view of a shielding structure associated with the single-turn inductor of FIG. 4 in accordance with an embodiment of the present invention.

FIG. 5 shows a top view of inductor shielding structure 202. As shown in FIG. 5, structure 202 may have the same general shape and size as inductor 200 and may be formed using a figure 8 routing arrangement. This figure 8 routing arrangement in which current can flow in a continuous circular fashion through the windings in structure 202 is sometimes referred to as a "closed loop" configuration (i.e., one can trace along the windings of structure 202 and will arrive back at the starting point). In particular, structure 202 may have a first loop portion 220-1 and a second loop portion 220-2 that are joined by crossings 204 and 204' formed at the center of structure 202. The majority of structure 202 may be formed in the same metal routing layer. The portion of structure 202 at which the first and second loop portions are connected may, however, be formed using structures that are formed in a different metal routing layer.

In the example of FIG. 5, all of loop portions 220-1 and 220-2 and crossing 204 may be formed using metal routing structures formed in a first metal routing layer. Metal crossing 204' may, however, be formed in a second metal routing layer that is below the first metal routing layer. Crossing 204' may be coupled to the first and second loop portions through respective via structures 206 extending from the first metal routing layer to the second metal routing layer. Crossing 204' formed in this way may sometimes be referred to as a cross-over bridge or an underpass. In other suitable arrangements, crossing 204' may be formed as an overpass (e.g., bridge 204' may be formed in a third metal routing layer that is above the first metal routing layer).

Consider an example in which inductor 200 is formed in a third metal ("M3") routing layer in the dielectric stack and in which the first and second loop portions of shielding structure 202 is formed in a second metal ("M2") routing layer in the dielectric stack. In this scenario, crossing 204 will be formed in the M2 metal layer whereas crossing 204' may either be formed in a first ("M1") metal routing layer or the M3 metal layer in the dielectric stack. Note that the M2 metal layer is the immediate metal routing layer above the M1 metal layer in the dielectric stack, and that the M3 metal layer is the immediate metal routing layer above the M2 metal layer in the dielectric stack. This is merely illustrative. In general, structures 200 and 202 may be formed in any layer in the dielectric stack (e.g., structures 200 and 202 may be formed near the bottom of the dielectric stack close to the substrate, near the top of the dielectric stack far from the substrate, or in intermediate layers between the bottom and the top of the dielectric stack).

Consider again the scenario described above in which inductor 200 receives a positive signal at input T1 and a negative signal at input T2. This particular biasing arrangement may result in a current 201 to flow through inductor 200 in a counterclockwise direction (FIG. 4). Referring back to FIG. 5, current 201 flowing through inductor 200 may induce a current 203 to flow through the first loop portion 220-1 in the clockwise direction and may also induce a current 205 to flow through the second loop portion 220-2 in the clockwise direction. Because the first and second loop portions 220-1 and 220-2 are cross-coupled in a closed-loop figure 8 configuration, currents 203 and 205 actually cancel out with each other (e.g., the symmetry and the cross-routing of shielding structure 202 ensures that the current induced in portion 220-1 cancels out with the current induced in portion 220-2). As a result, there is no magnetically induced current flowing in structure 202. This helps ensure that minimal current will be induced magnetically in the shield structure, which avoid cancelling the inductance provided by the inductor and also helps reduce loss.

Figure 6:
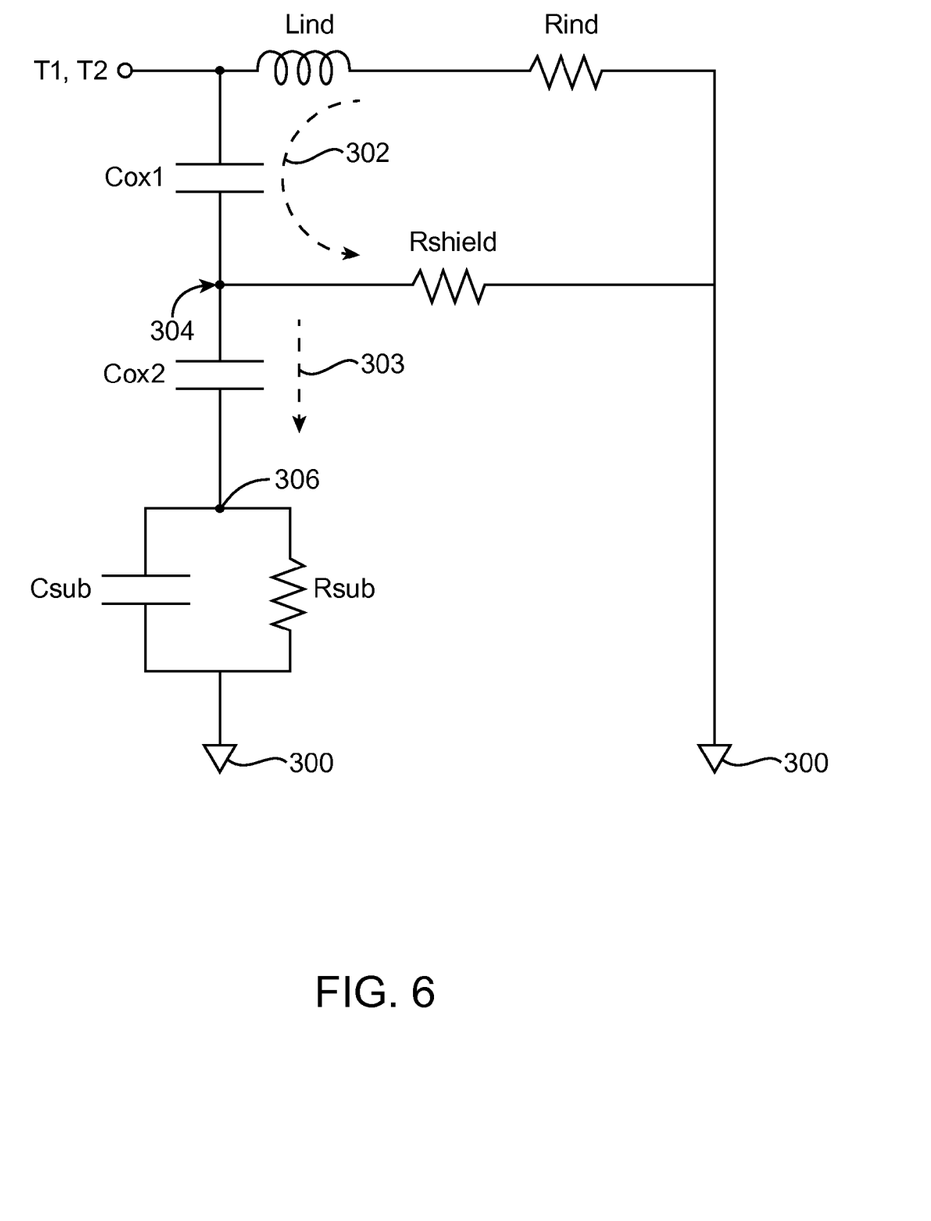
FIG. 6 is a simplified equivalent differential half-circuit diagram of an inductor of the type shown in FIG. 3 in accordance with an embodiment of the present invention.

Another advantage resulting from the use of the inductor shielding structure can be illustrated by analyzing the equivalent differential half circuit diagram of structures 200 and 202 on substrate 210 (FIG. 3). FIG. 6 shows the equivalent half circuit diagram of the inductor stack-up (including the inductor shielding structure) on the substrate. As shown in FIG. 6, the equivalent circuit may include an inductance Lind, resistances Rind, Rshield, and Rsub, and capacitances Cox1 and Cox2. Lind may represent the inductance of inductor 200, whereas Rind may represent the parasitic resistance in the winding of inductor 200. Cox1 may represent the parasitic capacitance from inductor 200 to shielding structure 202, whereas Cox2 may represent the parasitic capacitance from shielding structure 202 to substrate 210. Csub may represent the capacitance of substrate 210, whereas Rsub may represent the resistance of substrate 210. Rshield may represent the resistance in the winding of shielding structure 202.

Lind and Rind may be coupled in series between the input-output terminal (T1 or T2) and ground 300. Ground 300 may represent a "small signal" ground that is located at a point along the loop of structures 200 and 202 where the differential behavior is constant. Cox1 may be coupled between the input-output terminal and node 304. Rshield may be coupled between node 304 and ground 300. Cox2 may be coupled between nodes 304 and 306. Csub and Rsub may be coupled in parallel between node 306 and ground 300.

Due to the presence of parasitic capacitances Cox1 and Cox2, current can still flow from inductor 200 into structure 202 via Cox1 and from inductor 200 into the substrate via Cox2. In accordance with an embodiment, the structure 202 may be designed such that Rshield is substantially less than the effective impedance of the parasitic path to the substrate (e.g., the equivalent impedance of Rshield should be less than the equivalent impedance of Cox2 in series with the parallel connection of Csub and Rsub). Configured in this way, more current will flow into Rshield (as indicated by arrow 302) as opposed to flowing through the substrate (as indicated by arrow 303). If the loss resulting from Rshield is lower than the loss resulting from Rsub if there were no shielding structure 202 (which should be the case if Rshield is designed to be less than Rsub), the use of shielding structure 202 will help reduce loss and improve the Q factor of the LC tank.

Figure 7:
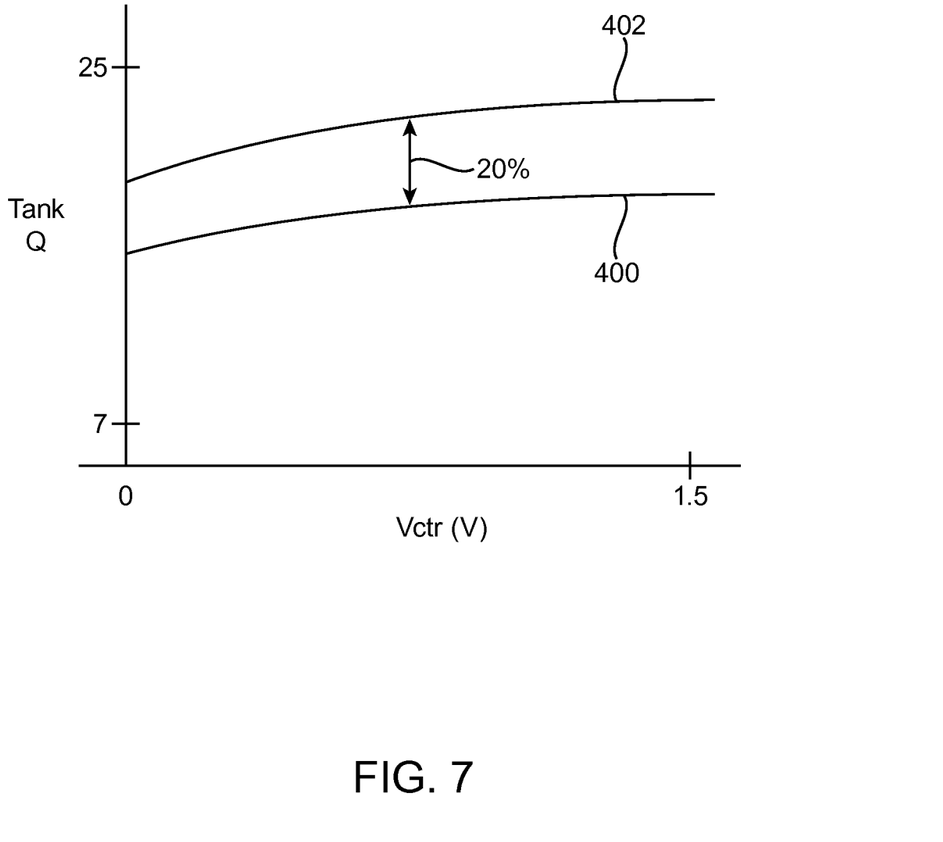
FIG. 7 is a diagram showing how an LC tank having an inductor substrate shielding structure exhibits a higher Q factor compared to an LC tank lacking an inductor substrate shielding structure in accordance with an embodiment of the present invention.

This improvement is shown in FIG. 7 in which the performance of an LC tank having an inductor shielding structure is compared with a conventional LC tank that lacks the inductor shielding structure. Curve 400 may represent the tank Q factor as a function of tuning voltage Vctr for a conventional LC tank without inductor shield 202. Curve 402 may represent the tank Q factor as a function of Vctr for an improved LC tank that includes inductor shield 202. As shown in FIG. 7, the LC tank associated with curve 402 exhibits a 20% performance improvement over that of the conventional LC tank across the entire tuning range.

Figure 8:
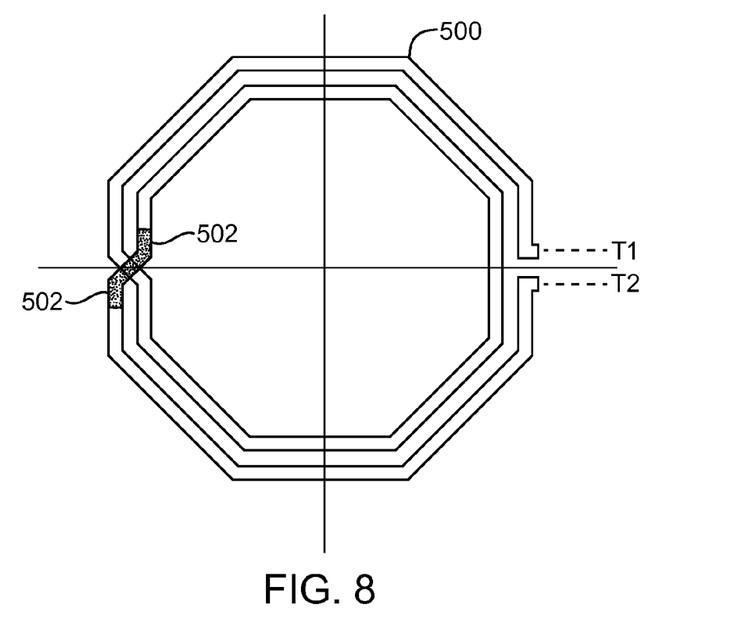
FIG. 8 is a top view of an illustrative two-turn inductor in accordance with an embodiment of the present invention.

In another suitable arrangement of the present invention, the inductor in the LC tank can be implemented in a two-turn winding configuration (see, e.g., FIG. 8). As shown in FIG. 8, inductor 500 having a first port T1 and a second port T2 may have two turns and may have a crossing point at which an underpass 502 can be formed. If desired, an overpass can also be formed at the crossing point.

Figure 9:
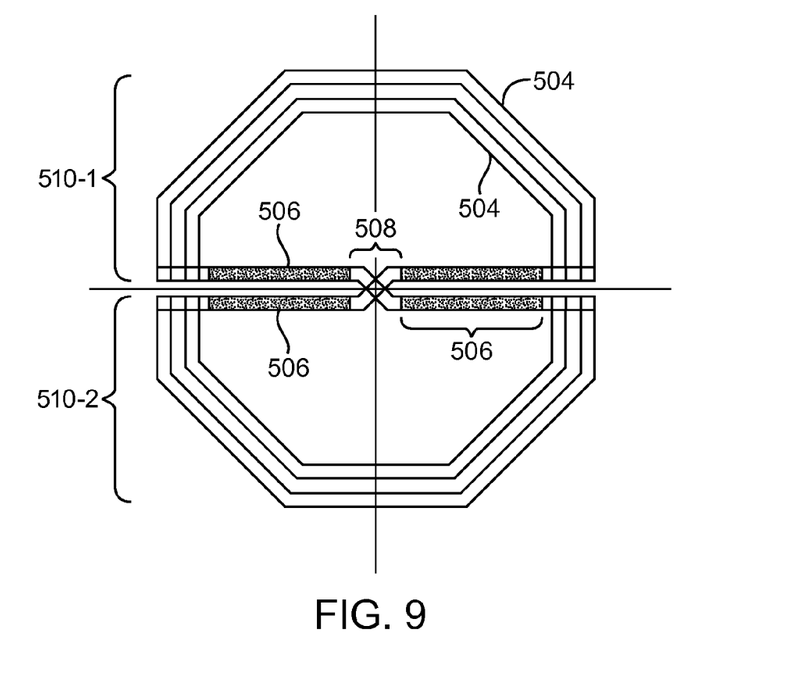
FIG. 9 is a top view of a shielding structure associated with the two-turn inductor of FIG. 8 in accordance with an embodiment of the present invention.

FIG. 9 shows an inductor shielding structure 504 than can be used in conjunction with the two-turn inductor 500 of FIG. 8. Similar to inductor 500, structure 504 may have two parallel windings. Structure 504 may also be considered to be a closed loop structure. Shielding structure 504 may have a first loop portion 510-1 and a second loop portion 510-2 that are joined at crossing point 508 located at the center of structure 504. Overpass and/or underpass bridges can be formed at crossing region 508 to properly connect portions 510-1 and 510-2. If desired, inductor 500 may be implemented using loops formed in two adjacent metal routing layers, where the loops are shorted in parallel along the entire winding path through vias. An example of such parallel loop connection can be found in U.S. Pat. No. 8,068,003, which is incorporated by reference herein in its entirety. Forming inductor 500 in this way can help further improve the Q factor.

In some arrangements, paths 506 connecting the outer loop portions to the crossing region 508 may be formed using conductive paths formed in more than one metal routing layer and shorted in parallel to help reduce routing resistance. Forming conductive paths 506 in multiple metal layers and shorting them together effectively lowers Rshield and Lshield (FIG. 6), which can help further reduce energy loss and increase the Q factor.

Structure 504 may be interposed between inductor 500 and the substrate. Consider an example in which inductor 500 is formed in the M2 and M3 metal routing layers (e.g., inductor 500 will have first loops formed in the M2 layer and second loops formed in the M3 layer that are shorted in parallel with the first loops). Bridge 502 may only be formed in the M1 metal layer (assuming an underpass arrangement at the inductor crossing point).

Light shielding structure 504 may be formed in the M1 metal routing layer (e.g., the first loop portion 510-1 and the second loop portion 510-2 may be formed in the M1 layer). Conductive paths 506 linking the peripheral first and second loop portions may be formed in the M1, M2, and/or M3 metal routing layers, all of which are shorted in parallel to help reduce resistance. Crossing region 508 of structure 504 may be implemented using appropriate underpass/overpass bridges formed in the M1, M2, and/or M3 metal routing layers and associated vias to ensure proper connection. This is merely illustrative. In general, structures 500 and 504 may be formed in any layer in the dielectric stack and may have any number of turns.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The foregoing is merely illustrative of the principles of this invention and various modifications can be made by those skilled in the art. The foregoing embodiments may be implemented individually or in any combination.

Although the invention has been described in some detail for the purposes of clarity, it will be apparent that certain changes and modifications can be practiced within the scope of the appended claims. Although some of the appended claims are single dependent only or reference only some of their preceding claims, their respective feature(s) can be combined with the feature(s) of any other claim.

What is claimed is:

1. An integrated circuit, comprising:
   a substrate;
   an inductor that is formed over the substrate and that comprises a loop having a center; and
   an inductor shielding structure interposed between the inductor and the substrate, wherein the inductor shielding structure comprises a closed loop structure that is electrically floating and a crossover region that is aligned to the center of the loop of the inductor.

2. The integrated circuit defined in claim 1, wherein the inductor has a shape, and wherein the inductor shielding structure has a shape that is substantially similar to the shape of the inductor.

3. The integrated circuit defined in claim 1, wherein the crossover region includes a selected one of an overpass bridging structure and an underpass bridging structure.

4. The integrated circuit defined in claim 1, wherein the inductor shielding structure is symmetrical.

5. The integrated circuit defined in claim 1, further comprising:
   a dielectric stack formed on the substrate, wherein the inductor and the inductor shielding structure are formed in the dielectric stack, and wherein at least a portion of the inductor shielding structure is formed using conductive structures in at least two conductive routing layers in the dielectric stack.

6. The integrated circuit defined in claim 1, wherein the crossover region is formed at the center of the inductor shielding structure.

7. The integrated circuit defined in claim 6, wherein the inductor shielding structure has conductive paths connecting the crossover region to outer loop portions of the inductor shielding structure, and wherein the conductive paths are formed using conductive structures in at least two conductive routing layers in the dielectric stack.

8. The integrated circuit defined in claim 1, further comprising:
   capacitor circuitry coupled in parallel with the inductor.

9. A method of forming a resonant circuit on an integrated circuit having a substrate, comprising:
   forming an inductor over the substrate, wherein the inductor comprises a loop having a center; and
   forming a shielding structure between the inductor and the substrate, wherein the shielding structure comprises a closed loop structure and a crossover region, wherein the crossover region is aligned to the center of the loop of the inductor, and wherein the shielding structure exhibits no induced current from the inductor during operation of the resonant circuit.

10. The method defined in claim 9, further comprising:
    forming a dielectric stack on the substrate, wherein forming the inductor over the substrate comprises forming the inductor in at least two metal routing layers in the dielectric stack.

11. The method defined in claim 10, wherein forming the shielding structure comprises forming the shielding structure in a metal routing layer below that in which the inductor is formed.

12. The method defined in claim 10, wherein forming the shielding structure comprises forming a portion of the shielding structure in at least two metal routing layers in the dielectric stack.

13. The method defined in claim 10, wherein forming the shielding structure comprises forming a portion of the shielding structure in at least three metal routing layers in the dielectric stack.

14. The method defined in claim 9, further comprising:
forming a dielectric stack on the substrate, wherein forming the shielding structure comprises forming only a center portion of the shielding structure in more than one metal routing layer in the dielectric stack.

15. The method defined in claim 9, further comprising:
forming variable capacitor circuitry in parallel with the inductor.

16. Circuitry, comprising:
a semiconductor substrate;
an inductor formed over the semiconductor substrate;
an inductor shielding structure formed over the substrate, wherein the inductor shielding structure is implemented in a figure 8 routing configuration and includes a cross-over region, and wherein the inductor and the inductor shielding structure have the same footprint.

17. The circuitry defined in claim 16, wherein the inductor shielding structure is interposed between the inductor and the semiconductor substrate.

18. The circuitry defined in claim 16, wherein the inductor shielding structure comprises a closed loop structure.

19. The circuitry defined in claim 18, wherein the inductor shielding structure exhibits minimal magnetically induced current from the inductor during normal operation of the circuitry.

\* \* \* \* \*